(12) United States Patent
Yamaguchi et al.

(10) Patent No.: US 8,164,899 B2
(45) Date of Patent: Apr. 24, 2012

(54) DUST-AND-WATER PROOF CASING

(75) Inventors: Shingo Yamaguchi, Kawasaki (JP); Satoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 210 days.

(21) Appl. No.: 12/759,127

(22) Filed: Apr. 13, 2010

(65) Prior Publication Data

US 2010/0265656 A1 Oct. 21, 2010

(30) Foreign Application Priority Data

Apr. 17, 2009 (JP) ................................ 2009-101280

(51) Int. Cl.
*G06F 1/16* (2006.01)
(52) U.S. Cl. .................................. 361/679.55; 220/4.21
(58) Field of Classification Search ............. 361/679.55; 220/4.21
See application file for complete search history.

(56) References Cited

U.S. PATENT DOCUMENTS

| | | | | |
|---|---|---|---|---|
| 5,023,824 A * | 6/1991 | Chadima et al. | ......... | 361/679.09 |
| 5,531,950 A * | 7/1996 | Kimura et al. | ............. | 264/135 |
| 6,532,152 B1 * | 3/2003 | White et al. | ........... | 361/692 |
| 6,568,551 B2 * | 5/2003 | Grossenbacher | .......... | 220/4.02 |
| 6,629,619 B2 * | 10/2003 | Sato et al. | ............... | 220/4.02 |
| 6,646,864 B2 * | 11/2003 | Richardson | ............... | 361/679.3 |
| 7,180,735 B2 * | 2/2007 | Thomas et al. | ........... | 361/679.56 |
| 7,431,171 B2 * | 10/2008 | Lamarche | .................. | 220/4.21 |
| 7,436,653 B2 * | 10/2008 | Yang et al. | ............... | 361/679.01 |
| 7,697,269 B2 * | 4/2010 | Yang et al. | ............... | 361/679.01 |
| 2004/0031795 A1 * | 2/2004 | Galland et al. | ............... | 220/4.21 |
| 2006/0169689 A1 * | 8/2006 | Carnevali et al. | ........... | 220/4.21 |
| 2006/0171107 A1 * | 8/2006 | Yamamoto et al. | .......... | 361/683 |
| 2007/0272688 A1 * | 11/2007 | Longo et al. | ................. | 220/4.23 |
| 2008/0066705 A1 | 3/2008 | Todo et al. | | |
| 2008/0316695 A1 * | 12/2008 | Arends et al. | ................ | 361/683 |
| 2011/0211309 A1 * | 9/2011 | Gandhi | .................... | 361/679.26 |

FOREIGN PATENT DOCUMENTS

| | | |
|---|---|---|
| JP | 2002-111246 A | 4/2002 |
| JP | 2008-75519 A | 4/2008 |
| JP | 2008-92096 A | 4/2008 |
| KR | 20-0258153 Y1 | 12/2001 |
| KR | 2002-0079694 A | 10/2002 |

OTHER PUBLICATIONS

Korean Office Action dated Jun. 30, 2011, issued in corresponding Korean Patent Application No. 10-2010-0026338.

* cited by examiner

*Primary Examiner* — Lisa Lea Edmonds
(74) *Attorney, Agent, or Firm* — Westerman, Hattori, Daniels & Adrian, LLP

(57) ABSTRACT

In order to seal an internal space of a casing having an upper and lower casing members, a continuous groove with a semicircular cross-section is formed around a dust-and-water proof area of the lower casing member, and a continuous elongated protrusion is formed on the portion of the upper casing member corresponding to the groove, so that the protrusion is inserted in the groove when two casing members are engaged. Spherical sealing members each having the same diameter as the groove width are arrayed continuously in the groove without gaps therebetween. The width of the elongated protrusion is configured to be smaller than the groove width, so that the spherical sealing members compressed when the casing members are fitted are deformed to enter a space defined between the elongated protrusion and the groove, to thereby form a dust-and-water proof structure. Inserting the spherical sealing members in the groove is easy.

17 Claims, 16 Drawing Sheets

FIG.4A
FIG.4B
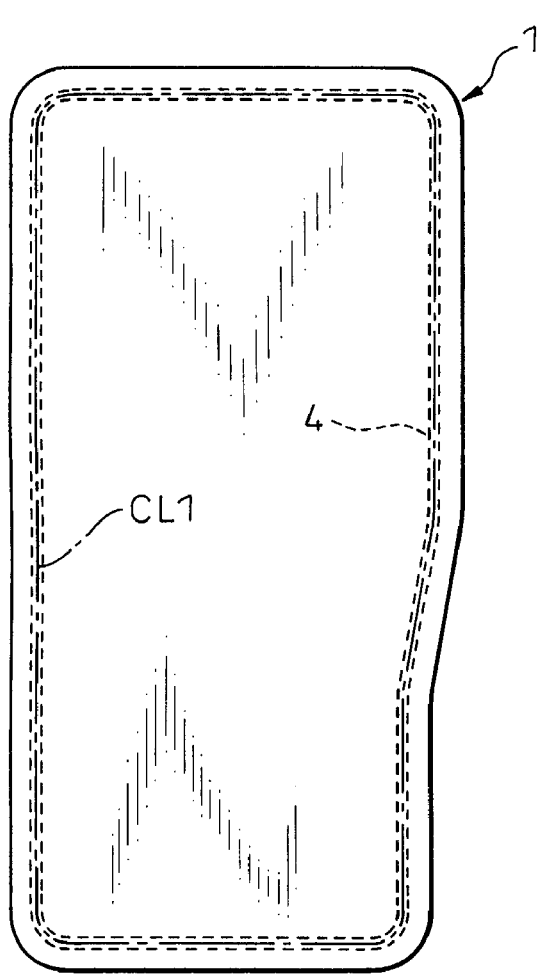
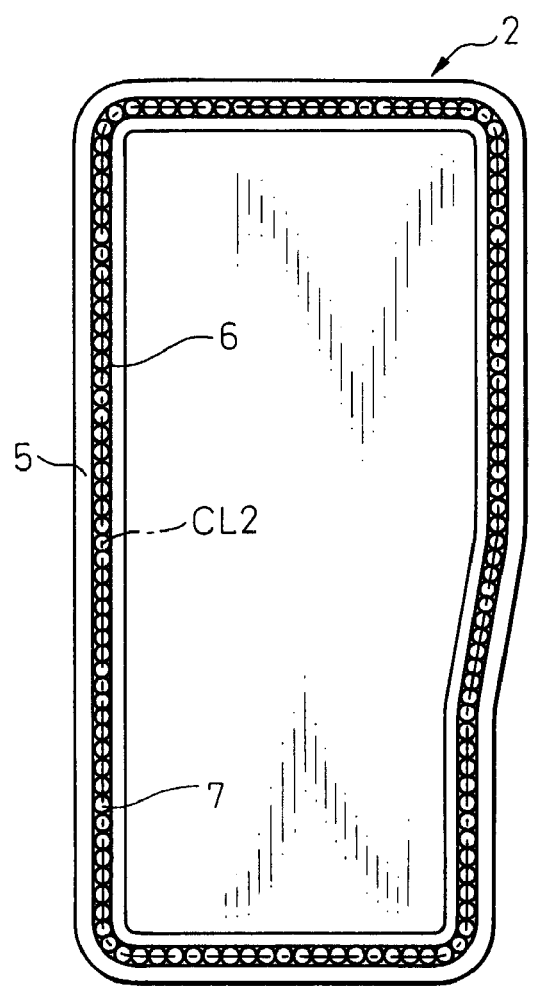

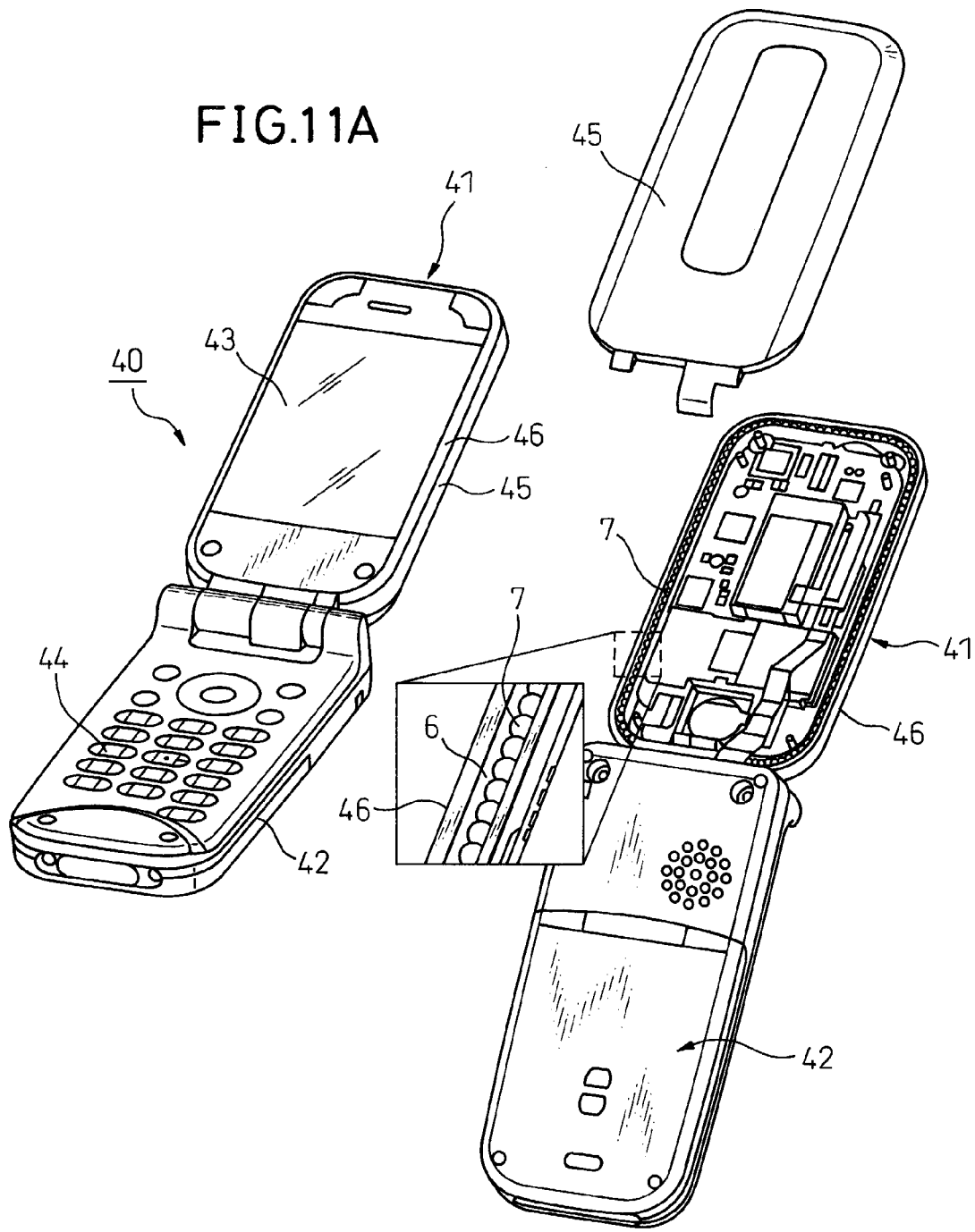

DUST-AND-WATER PROOF CASING

CROSS-REFERENCE TO RELATED APPLICATION

This application claims priority from, and incorporates by reference the entire disclosure of Japanese Patent Application No. 2009-101280, filed on Apr. 17, 2009.

FIELD

This application relates to a casing with a dust-and-water proof structure for sealing a fitting portion of two casing members to prevent dust or water from entering inside the casing.

BACKGROUND

Conventionally, various dust-and-water proof structures for a casing are known wherein a casing having an internal space is split into two halves, and the fitting surfaces of the two casing halves are sealed so that dust or water droplets do not enter inside the casing. For example, Japanese Unexamined Patent Publication (Kokai) No. 2008-92096 discloses a structure to seal the fitting surfaces of two casing halves of an electronic device, such as a mobile phone handset, in order to prevent water from entering inside. Also, Japanese Unexamined Patent Publication (Kokai) No. 2002-111246 discloses a water proof structure for a device used outside. Since the dust proof function of a casing can be identical, to the water proof function, only a water proof structure will be explained below.

Japanese Unexamined Patent Publication (Kokai) No. 2008-92096 illustrates a water proof structure of a body casing of a foldable mobile phone handset. The foldable mobile phone handset is provided with a front casing member provided with operation key holes and a rear casing member, wherein a water proof packing, such as an O-ring made of rubber, is held between the fitting surfaces of both casings. The front casing member is provided with a groove at the fitting portion with the rear casing member, and the water proof packing is fitted in the groove. The rear casing member is provided with an elongated protrusion at the fitting portion with the front casing member. When the front casing member and the rear casing member are engaged, the elongated protrusion is inserted in the groove, so that the water proof packing fitted in the groove is compressed, to realize the water proof structure.

On the other hand, the casing described in Japanese Unexamined Patent Publication (Kokai) No. 2002-111246 comprises a cover and a casing body closed by the cover, wherein the casing body is provided on its upper end with a wall portion having a predetermined height, and inner peripheral surfaces of the casing body and the wall portion are continuous. The inner peripheral surface of the cover is fitted onto an outer peripheral surface of the wall portion. The overall length of an elastic packing held between the cover and the casing body is shorter than the overall circumference of the wall portion, and the elastic packing, when mounted, is stretched. Also, there is a recess inside the periphery of the cover, and when the cover and the casing body are engaged using screws, the elastic packing is compressed in the recess to provide a water proof structure.

Further, other than the water proof structures mentioned above, which use water proof packing or elastic packing, there is also known a water proof structure wherein one of the connecting surfaces of the two casings has a looped groove filled with a sealing agent, so that when the connecting surface is adhered to the connecting surface of the other casing half, water-tightness is established. Also, a structure is known, wherein after a sealing agent filled in the groove is cured, the sealing agent is compressed by the connecting surface of a mating casing half to seal.

However, in the water proof structures disclosed in Japanese Unexamined Patent Publication (Kokai) No. 2008-92096 or in Japanese Unexamined Patent Publication (Kokai) No. 2002-111246, wherein a looped packing is used, the packing must be fitted in the groove or stretched to fit in the wall portion when the casing is assembled, thus leading to an increase of the number of assembly steps. Moreover, if the groove extends meanderingly, or the portion to which the packing is to be attached is three dimensional (cubic), it is necessary to deform and mount the packing in accordance with the shape of the groove, therefore, an operator must be highly skilled or very careful in assembling the casing, thus resulting in troublesome operations. In addition, the packing, if mounted twistedly, may fail to seal.

On the other hand, in the water proof structure using a sealing agent, the sealing function cannot be provided until the sealing agent is hardened, therefore, the assembling efficiency is reduced. Also, after the sealing agent is hardened, the connecting surfaces are adhered firmly to each other, therefore, it is necessary to destroy the sealed portion when the casing is disassembled for maintenance or repair, thus, it is inconvenient to repair or recycle the casing. Moreover, in the structure wherein the casing members are adhered to each other after the sealing agent filled in the groove is completely hardened, there is a possibility that an elastic deformation of the sealing agent occurs before it is hardened, and if such a deformation occurs, a dimensional deviation or positional displacement of the sealing agent may occur, thus leading to poor sealing performance.

SUMMARY

Therefore, the present application provides a casing having a dust-and-water proof structure, wherein a sealing member is not required to deform according to the shape of the groove, no twisting of the sealing member occurs when the sealing member is mounted in the sealing portion, so that a good sealing performance can be obtained, and the sealing member can be inserted in the groove without special proficiency, thus resulting in high operating efficiency.

According to an embodiment of a casing of the present application, a casing comprising two casing members is provided, one of which is fittable to the other casing member to form the casing, wherein a dust-and-water proof structure provided at a fitting portion comprising a groove formed continuously along periphery of a dust-and-water proof area of the one casing member, an elongated protrusion formed at the position to be inserted in the groove when the two casing members are fitted, the elongated protrusion having a width smaller than the groove width, and spherical elastic bodies each having the same diameter as the groove width, which are inserted and continuously arranged in the groove without gaps therebetween.

Alternatively, spherical elastic bodies each having a diameter identical to 70% to 100% of the groove width may be continuously arrayed in the groove without gaps therebetween. In this alternative, when the diameter of the spherical elastic body is 70% of the groove width, the width of the elongated protrusion is such that the tops of the spherical elastic bodies can be compressed by the elongated protrusion so that no irregular deformation of the spherical elastic bodies compressed by the elongated protrusion in the groove occurs, when the casing members are engaged.

The advantages of the application will be realized and attained by means of the elements and combinations particularly pointed out in the claims. It is to be understood that both the foregoing general description and the following detailed description are exemplary and explanatory and are not restrictive of the application, so claimed.

BRIEF DESCRIPTION OF THE DRAWINGS

The present application is illustrated by way of example, and not limitation, in the figures of the accompanying drawings in which like references indicate similar elements. Note that the following figures are not necessarily drawn to scale.

FIG. 4A is a plan view of an upper casing member in the first embodiment.

FIG. 4B is a plan view, illustrating a lower casing member having a groove portion in which spherical sealing members are inserted, in the first embodiment.

FIG. 11A is a perspective view of an exterior appearance of a foldable mobile phone provided with a casing of the present application.

FIG. 11B is a rear perspective view of the foldable phone of FIG. 11A, in which the rear casing member of the movable portion is open, to illustrate the mounting position of the spherical sealing members of the present application, and an enlarged view of a part thereof.

DESCRIPTION OF EMBODIMENTS

Before describing the preferred embodiments, an explanation will be given of a conventional water proof structure of a casing illustrated in FIGS. 1A and 1B.

Figure 1A:
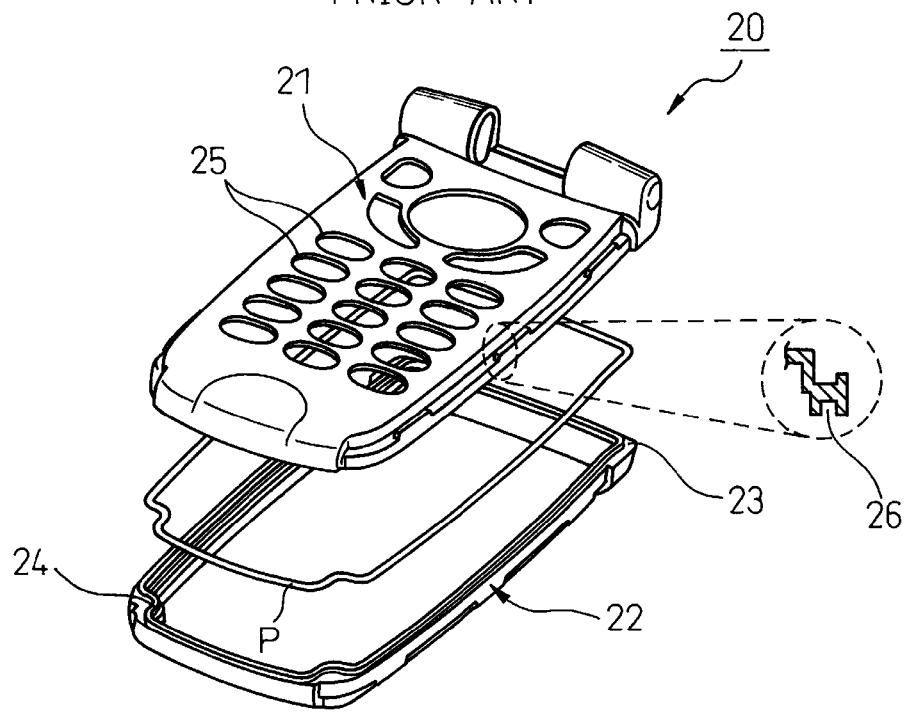
FIG. 1A is a perspective view of a conventional foldable mobile phone handset in a disassembled state, illustrating a water proof packing to be mounted in a fitting portion of a front casing member and a rear casing member of a main body.

FIG. 1A illustrates a water proof structure for a device casing described in Japanese Unexamined Patent Publication (Kokai) No. 2008-92096. Japanese Unexamined Patent Publication (Kokai) No. 2008-92096 discloses a water proof structure of a casing on the main body side of a foldable mobile phone handset 20. FIG. 1A illustrates a front casing member 21 provided with operation key holes 25, and a rear casing member 22, which constitute the foldable mobile phone handset 20, wherein a water proof packing P, such as an O-ring made of a rubber, is held between the fitting surfaces of the two casing members. The front casing member 21 is provided with a groove 26 in the fitting portion 23 thereof with the rear casing member 22, as illustrated in a partial sectional view, and the water proof packing P is fitted in the groove 26. The rear casing member 22 is provided with an elongated protrusion 24 at a fitting portion 23 thereof with the front casing member 21. When the front casing member 21 and the rear casing member 22 are engaged, the elongated protrusion 24 is inserted in the groove 26, so that the water proof packing P fitted in the groove 26 is compressed to realize the water proof structure.

Figure 1B:
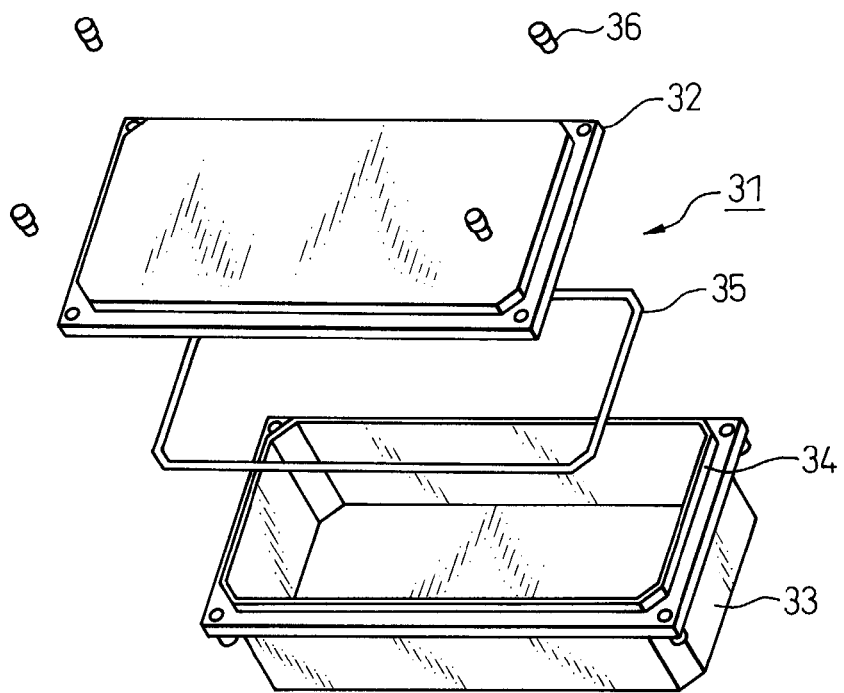
FIG. 1B is a perspective view, illustrating a water proof structure of a conventional casing provided with a casing cover, a casing body, and an elastic packing, in a disassembled state.

FIG. 1B illustrates a water proof structure of a casing 31 described in Japanese Unexamined Patent Publication (Kokai) No. 2002-111246. The casing 31 is comprised of a casing cover 32 and a casing body 33 closed by the casing cover 32. The casing body 33 is provided, on its upper part, with a predetermined height of a wall portion 34 which connects to an inner peripheral surface of the casing body 33. The inner peripheral surface of the casing cover 32 is fitted on an outer peripheral surface of the wall portion 34. The overall length of the elastic packing 35 which is held between the casing cover 32 and the casing body 33 is smaller than the entire circumference of the wall portion 34, so that the elastic packing 35 is stretched when it is fitted. Also, a recess is provided around the periphery of the casing cover 32, so that when the casing cover 32 and the casing body 33 are engaged using screws 36, the elastic packing 35 is compressed in the recess to realize a water proof structure.

Further, other than the above water proof structures using the water proof packing or the elastic packing, there is known a water proof structure wherein a looped groove is provided in one of the fitting surfaces of the two casing members, and a sealing agent is filled in the groove, so that the fitting surface is adhered to the fitting surface of the other casing member to seal the casing. Also, a structure is known wherein after a sealing agent filled in the groove is set, the sealing agent is compressed by the fitting surface of the other casing member to establish water tightness.

However, in the water proof structures disclosed in Japanese Unexamined Patent Publication (Kokai) No. 2008-92096 or in Japanese Unexamined Patent Publication (Kokai) No. 2002-111246, wherein a looped packing is used, the packing must be fitted in the groove or stretched to fit in the wall portion when the casing is assembled, thus leading to an increase of the number of assembly steps. Moreover, if the groove extends meanderingly, or the portion to which the packing is to be attached is three dimensional (cubic), it is necessary to deform and mount the packing in accordance with the shape of the groove, therefore, an operator must be highly skilled or very careful to assemble the casing, thus resulting in troublesome operations. In addition, the packing, if mounted twistedly, may fail to seal.

On the other hand, in the water proof structure using a sealing agent, the sealing function cannot be provided until the sealing agent is hardened, therefore, the assembly efficiency is reduced. Also, after the sealing agent is hardened, the connecting surfaces are adhered firmly to each other, therefore, it is necessary to destroy the sealed portion when the casing is disassembled for maintenance or repair, thus, it is inconvenient to repair or recycle the casing. Moreover, in the structure wherein the casing members are adhered to each other after the sealing agent filled in the groove is completely hardened, there is a possibility that an elastic deformation of the sealing agent occurs before it is hardened, and if such a deformation occurs, a dimensional deviation or positional displacement of the sealing agent may occur, thus leading to poor sealing performance. The present application is intended to eliminate these drawbacks of the prior art, and will be explained below in detail with reference to the embodiments.

Figure 2:
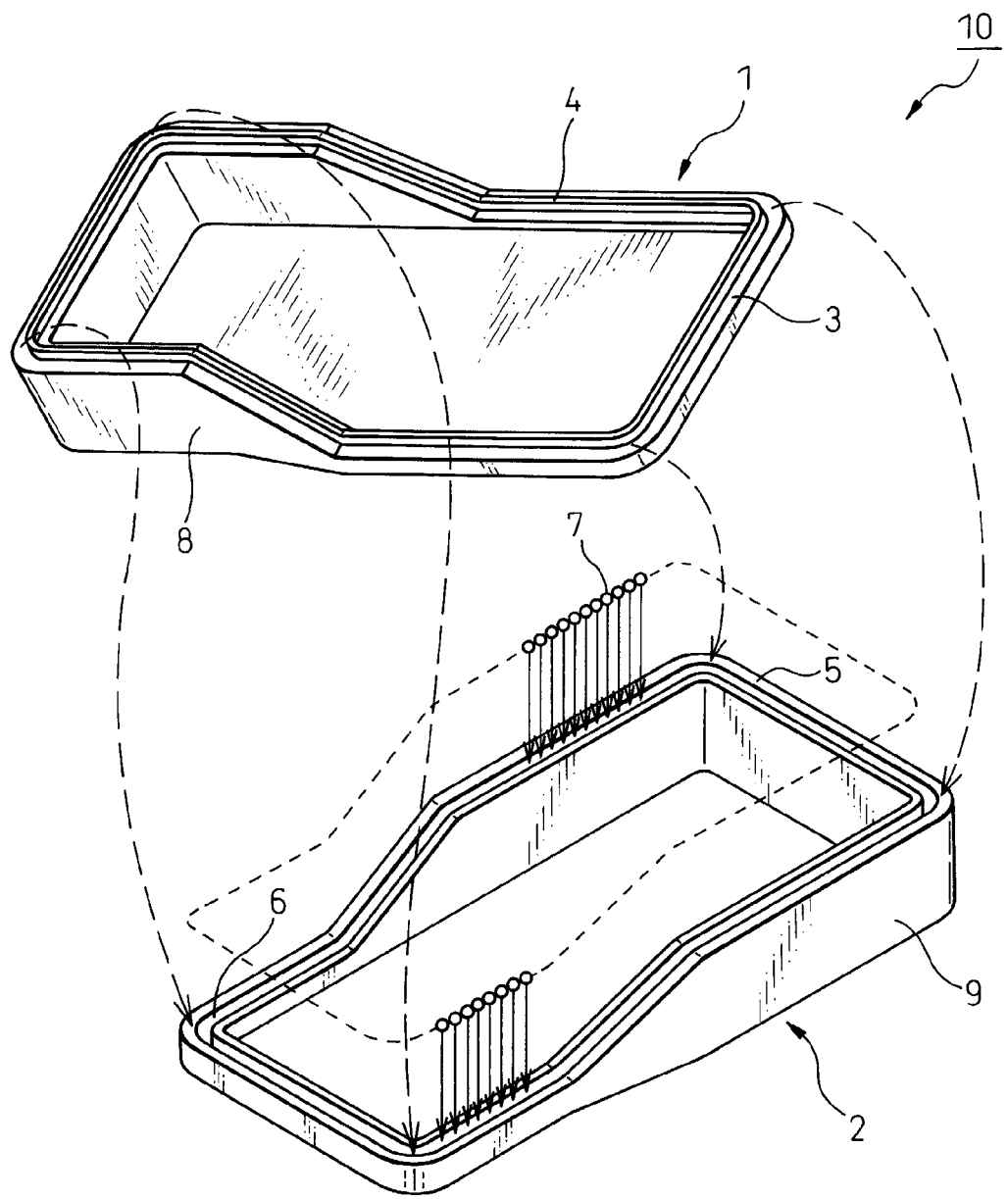
FIG. 2 is a perspective view, illustrating the first embodiment of a casing of the present application, which comprises spherical sealing members mounted in a three dimensional fitting portion of a lower casing member and an upper casing member, to be assembled.

FIG. 2 illustrates a structure of a dust-and-water proof casing 10 provided with the dust-and-water proof structure of the present application, according to the first embodiment. The dust-and-water proof casing 10 is comprised of an upper casing member 1, lower casing member 2, and spherical sealing members 7. In the dust-and-water proof casing 10 of this embodiment, the fitting surfaces of the upper casing member 1 and lower casing member 2 are not flat surfaces, but are of a three dimensional shape. The lower casing member 2 is provided with a wall portion 9 to form an internal space, and the end face of the wall portion 9 defines a fitting surface 5 of the lower casing member 2. The fitting surface 5 is provided with a looped groove 6. The upper casing member 1 is also provided with a wall portion 8 to form an internal space, and the end face of the wall portion 8 defines a fitting surface 3 of the upper casing member 1. The fitting surface 3 is provided with a looped elongated protrusion 4, which is to be inserted in the looped groove 6 of the lower casing member 2. The spherical sealing members 7 are spherical elastic bodies made of a solid gel-like material (for example, silicone-based material), and are arranged continuously and tightly in the groove 6 without gaps therebetween.

Figure 3:
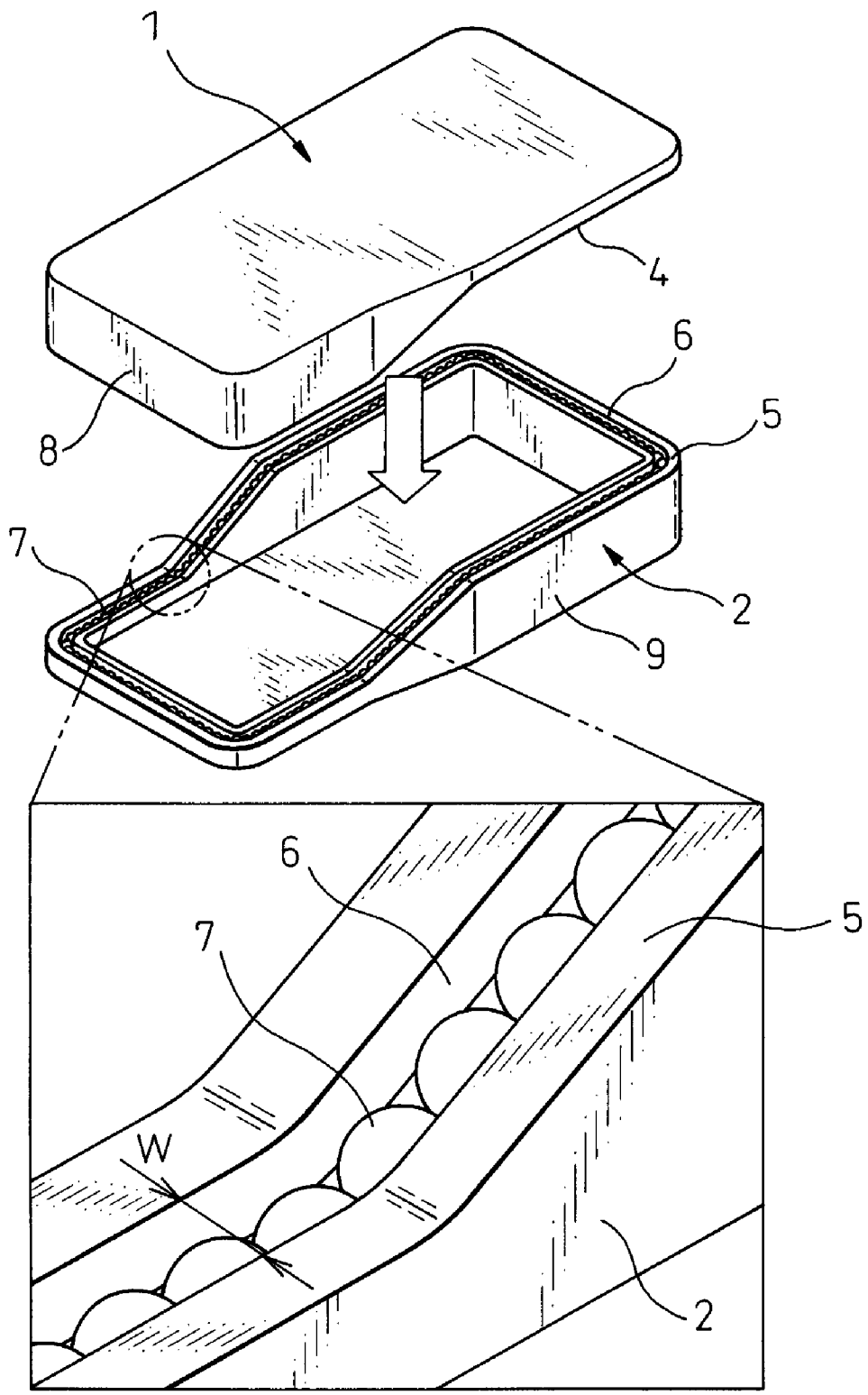
FIG. 3 is a perspective view, illustrating spherical sealing members inserted in a groove portion of a lower casing member in the first embodiment, on which an upper casing member is being fitted, and an enlarged partial view thereof.

FIG. 3 illustrates the spherical sealing members 7 arrayed in the groove 6 of the lower casing member 2 of the dust-and-water proof casing 10, before the upper casing member 1 is fitted to the lower casing member. The portion indicated with the dashed-two dotted line is enlarged. The spherical sealing members 7 are arranged continuously and tightly in the groove 6 of the lower casing member 2 without gaps therebetween. If it is assumed that W represents the width of the groove 6, the diameter of each spherical sealing member 7 is the same as the groove width W. This is because the line connecting the central positions of the spherical sealing members 7 arranged in the groove 6 may be deviated from the central line of the groove 6 so that there is a possibility that the sealing along the central line of the groove 6 may not be achieved, if the groove width W is greater than the diameter of each spherical sealing member 7.

FIG. 4A is a plan view of the upper casing member 1 provided with the looped elongated protrusion 4, and FIG. 4B is a plan view of the lower casing member 2 having the looped groove 6 in which the spherical sealing members 7 are arranged. The central line CL1 of the elongated protrusion 4 is identical to the central line CL2 of the groove 6, i.e., the line CL2 connecting the centers of the spherical sealing members 7 arranged in the groove 6. As a result, when the upper casing member 1 is fitted to the lower casing member 2, the central line CL1 of the elongated protrusion 4 overlaps the line CL2 connecting the centers of the spherical sealing members 7, so that the spherical sealing members 7 can be compressed by the elongated protrusion 4 inserted in the groove 6.

When it is assumed that TL represents the overall length of the central line CL2 of groove 6, and 2R represents the diameter of one spherical sealing member 7, the overall length TL of the central line CL2 of groove 6, the diameter 2R of the spherical sealing member 7, and the groove width are determined so that the value of (TL/2R) is an integer. This is because if the value of (TL/2R) is not an integer, there may be spaces generated between the spherical sealing members 7 arranged in the groove 6, or the spherical sealing members 7 may come out of the groove 6, and thus, lead to a sealing failure.

Figure 4C:
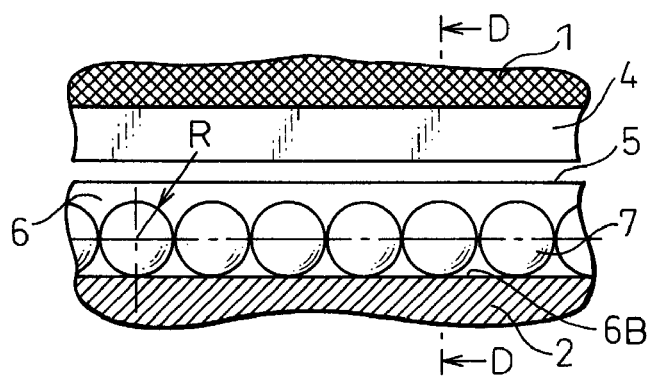
FIG. 4C is an enlarged partial sectional view immediately before the upper casing member is engaged to the lower casing member in the first embodiment.
Figure 4D:
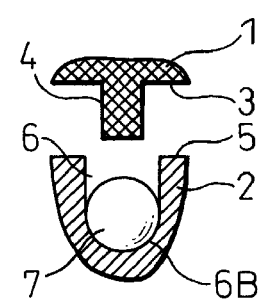
FIG. 4D is a sectional view taken along the line D-D illustrated in FIG. 4C.

FIG. 4C illustrates the upper casing member 1 which is being fitted to the lower casing member 2. FIG. 4D illustrates a cross-sectional view taken along the line D-D in FIG. 4C. In this embodiment, the depth of the groove 6 is greater than the diameter of each spherical sealing member 7, and therefore, there is a space between the tops of the spherical sealing members 7 arranged in groove 6 and the fitting surface 5 of the lower casing member 2. When R is assumed to represent the radius of one spherical sealing member 7, the shape of the bottom surface 6B of the groove 6 in this embodiment is such that the cross-section thereof is of a semicircle whose radius is R. Also, the width of the elongated protrusion 4 is smaller than the width W of the groove 6, so that when the spherical sealing members 7 are compressed by the elongated protrusion 4, the spherical sealing members 7 can be deformed and enter the space between the groove 6 and the elongated protrusion 4. Further, the height of the elongated protrusion 4 is smaller than the depth of the groove 6, for example, by the radius R of a spherical sealing member 7.

Figure 4E:
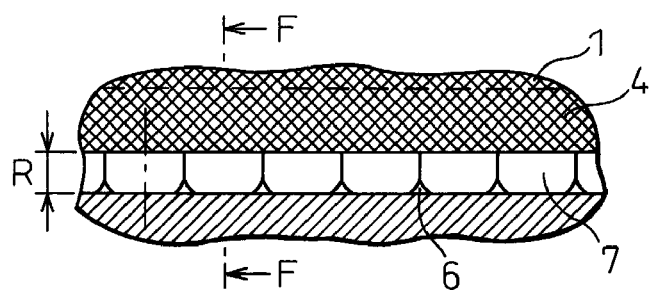
FIG. 4E is an enlarged partial sectional view of an upper casing member and a lower casing member fitted thereto in the first embodiment.
Figure 4F:
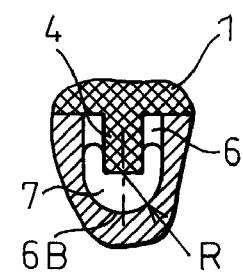
FIG. 4F is a sectional view taken along the line F-F illustrated in FIG. 4E.

FIG. 4E illustrates a state wherein the upper casing member 1 is fitted to the lower casing member 2, and FIG. 4F is a cross-sectional view taken along the line F-F illustrated in FIG. 4E. When the upper casing member 1 is fitted to the lower casing member 2, the spherical sealing members 7 are compressed by the elongated protrusion 4, thus, the compressed spherical sealing members 7 are deformed not only to fill the space between the top surface of the elongated protrusion 4 and the bottom surface of the groove 6, but also to enter the space between the groove 6 and the elongated protrusion 4, as illustrated in FIG. 4F. As a result, due to the compression deformation of the spherical sealing members 7, there are few spaces in the groove direction, as illustrated in FIG. 4E.

Figure 5A:
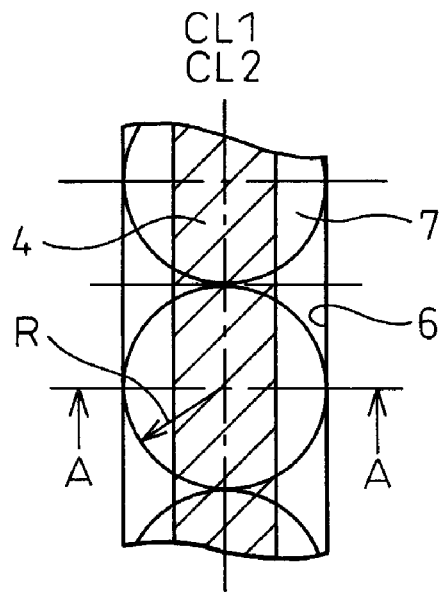
FIG. 5A is an explanatory view, illustrating the relationship among the width of a groove provided in the lower casing member, the diameter of spherical sealing members, and the width of the projection provided on the upper casing member, in the first embodiment.
Figure 5B:
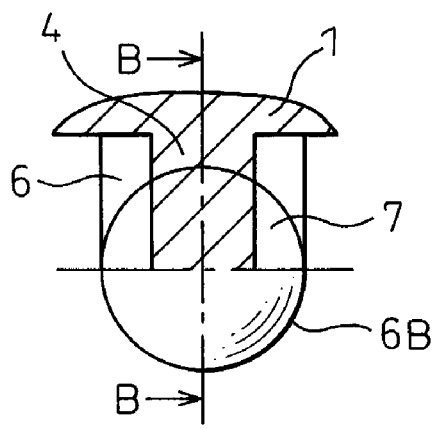
FIG. 5B is a sectional view taken along the line A-A in FIG. 5A.
Figure 5C:
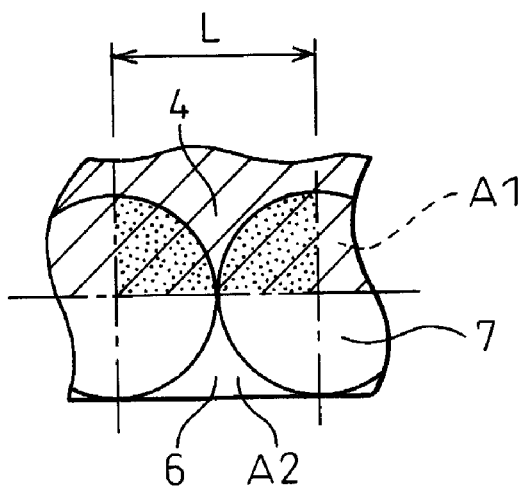
FIG. 5C is a sectional view taken along the line B-B in FIG. 5B.

As illustrated in FIGS. 5A and 5B, when the upper casing member 1 is fitted to the lower casing member 2, the central line CL1 of the elongated protrusion 4 and the line CL2 connecting the centers of the spherical sealing members 7 overlap each other, therefore, the deformed portions of the compressed spherical sealing members 7 evenly enter the space between the groove 6 and the elongated protrusion 4, as illustrated in FIG. 4F. The distance L between the centers of two spherical sealing members 7, as illustrated in FIG. 5C, is considered. If it is assumed that a spherical sealing member 7 is compressed by an amount corresponding to the radius R thereof (compression ratio of 50%), the sectional surface area A1 (indicated with dots) of the elastic body compressed by the elongated protrusion 4 is greater than the surface area of A2 of the space between two spherical sealing members 7. Therefore, when the compression ratio is 50%, the surface area A2 of the space between the two spherical sealing members 7 can be filled with the deformed portions of the spherical sealing members 7. The same is true for the remaining portion in the groove 6. As a result, the space between the adjacent spherical sealing members 7 can be filled with the deformed portions of the spherical sealing members 7, which results in good sealing performance.

Figure 6A:
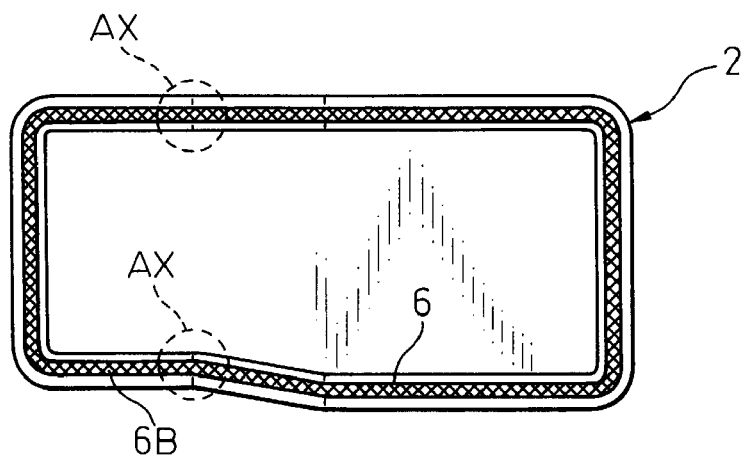
FIG. 6A is a plan view of a single lower casing member in the first embodiment.
Figure 6B:
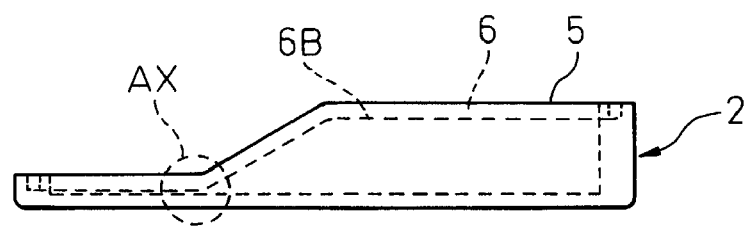
FIG. 6B is a side view of the lower casing member illustrated in FIG. 6A.
Figure 6C:
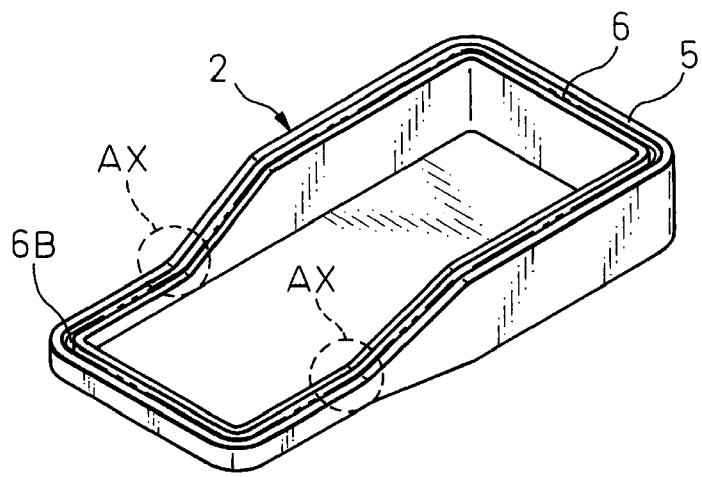
FIG. 6C is a perspective view of the lower casing member illustrated in FIGS. 6A and 6B.
Figure 6D:
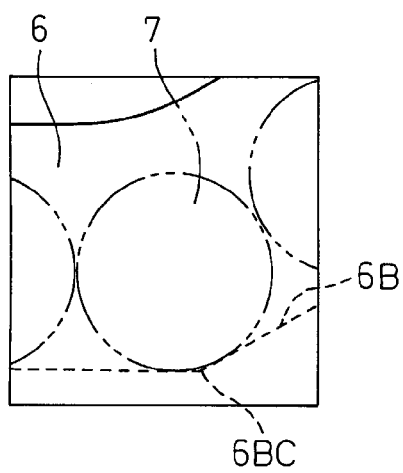
FIG. 6D is an enlarged partial side view of a part of the lower casing member illustrated in FIG. 6A to 6C circled with dashed lines, according to the prior art.
Figure 6E:
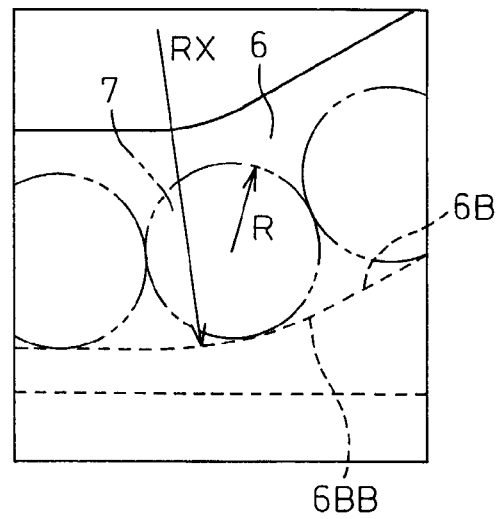
FIG. 6E is an enlarged partial side view of a part of the lower casing member illustrated in FIG. 6A to 6C circled with dashed lines, according to the present application.

FIGS. 6A to 6E illustrate the shape of a bent portion of the bottom surface 6B of the groove 6 of the lower casing member 2 in the first embodiment. In the first embodiment, the groove 6 is bent at a predetermined angle, with respect to the vertical direction, at the portions AX circled with dashed lines in FIGS. 6A to 6C. At the bent portions AX, if the bottom surface 6B of the groove 6 is bent linearly to form angular edge portions 6BC, as illustrated in FIG. 6D, spaces are formed between the edge portions 6BC and the spherical sealing members 7 arranged in the groove 6. In this case, there is a possibility that the spaces may not be filled with the deformed portions of the spherical sealing members 7 which are compressed and deformed, and thus, no sealing may be obtained.

To prevent this problem, in this embodiment, a curved portion 6BB is formed by curving the bottom surface 6B of the bent portion AX at a curvature of a large radius RX, which is, for example, equal to or greater than the radius R of a spherical sealing member 7. In this way, as the radius RX of the bottom surface of the groove 6 is equal to or greater than the radius R of a spherical sealing member 7 (RX≧R), no space is formed between the spherical sealing members 7 arranged in the groove 6 and the bottom surface 6B of the groove 6, thus a good sealing is achieved.

Figure 7A:
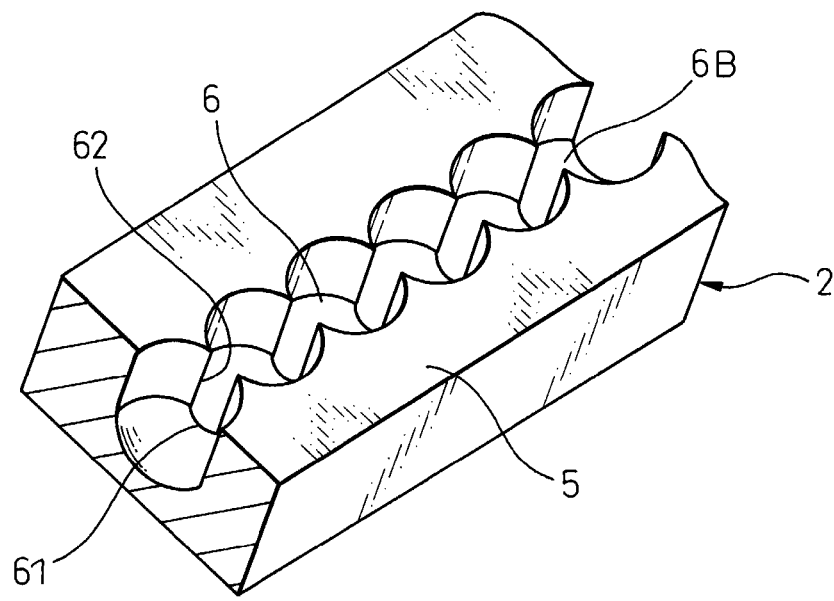
FIG. 7A is an enlarged partial perspective view, illustrating an example of the shape of a groove formed in a lower casing member in the second embodiment of the present application.
Figure 7B:
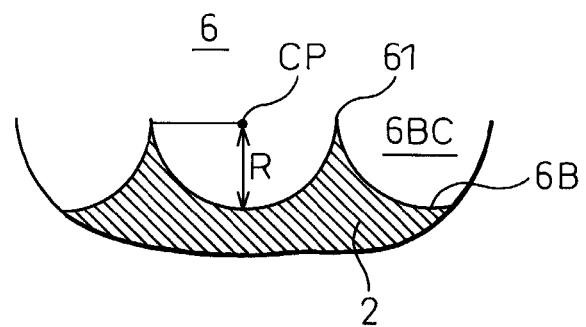
FIG. 7B is an enlarged partial sectional view of a bottom surface of the groove illustrated in FIG. 7A.

In the first embodiment explained above, the groove 6 provided in the fitting surface 5 of the lower casing member 2 has a bottom surface 6B whose sectional shape in the length direction is semicircular, and the lateral surfaces of the groove 6 are defined by parallel flat surfaces. The second embodiment of the present application differs from the first embodiment only in the shape of the groove 6 provided in the fitting surface 5 of the lower casing member 2. In the second embodiment, as illustrated in FIG. 7A, the bottom surface 6B of the groove 6 has a hemispherical shape, and the lateral surfaces of the groove 6 connecting to the hemispherical bottom surface 6B are cylindrically curved. FIG. 7B is an enlarged sectional view of a part of the bottom surface 6B of the groove 6 of FIG. 7A. As illustrated in FIG. 7B, an array of continuous hemispherical grooves 6BC, each defined by a circle whose center is located at a point CP and whose radius is R, is formed on the bottom surface 6B.

Figure 7C:
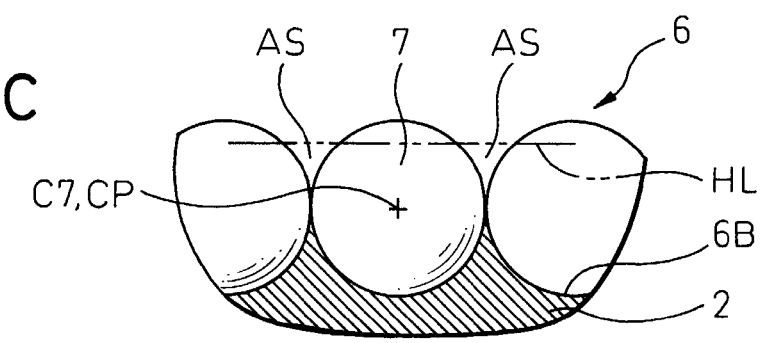
FIG. 7C is an enlarged partial sectional view of the groove of FIG. 7B, in which spherical sealing members are inserted.

Thus, due to the array of hemispherical grooves 6BC each having a radius R, formed on the bottom surface 6B of the groove 6, when the spherical sealing members 7 are arranged in the groove 6, the center CP of the hemispherical groove BC and the center C7 of the spherical sealing member 7 are identical to each other, as illustrated in FIG. 7C, and the spherical sealing members 7 are arranged continuously and tightly in the groove 6 without gaps therebetween. Moreover, in this state, there are no spaces below the spherical sealing members 7. Therefore, in the second embodiment, the space AS above the spherical sealing members 7 arranged in the groove 6 is filled with the compressed portions of the spherical sealing members 7 formed by the elongated protrusion 4 of the upper casing member 1.

For this reason, in the first embodiment, the spherical sealing members 7 are compressed at a compression ratio of 50%, by the elongated protrusion 4 of the upper casing member 1, whereas in the second embodiment, the compression ratio of the spherical sealing members 7 can be reduced to less than 50%. Namely, the height of the elongated protrusion 4 provided on the upper casing member 1 can be smaller than that in the first embodiment. In the second embodiment, for example, the space AS can be filled, by compressing the tops of the spherical sealing members 7 to the position HL by the elongated protrusion 4.

Figure 8A:
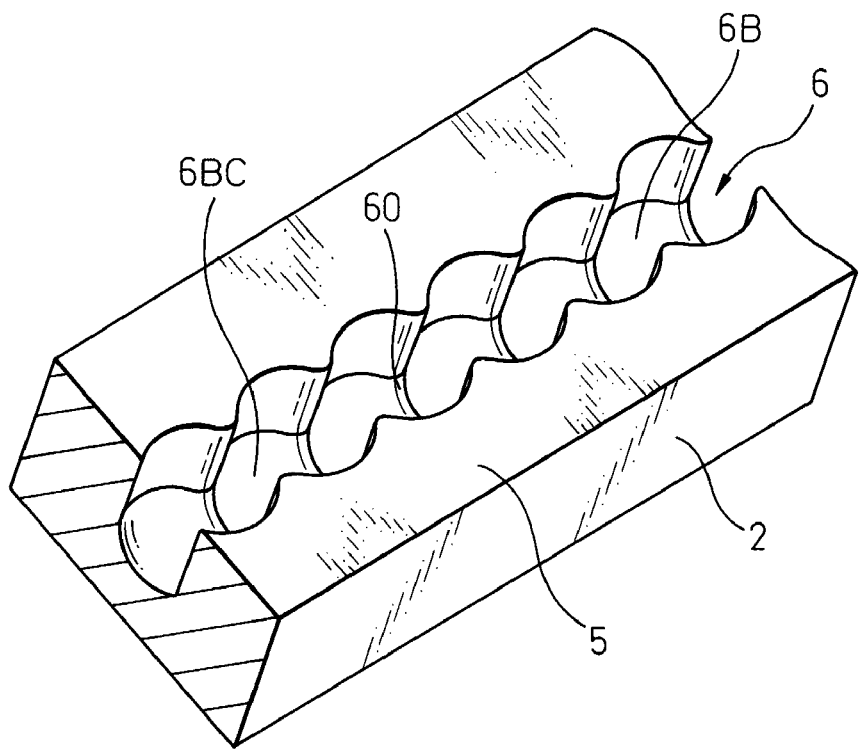
FIG. 8A is an enlarged partial perspective view illustrating a variant of the shape of a groove formed in a lower casing member of the second embodiment of the present application.
Figure 8B:
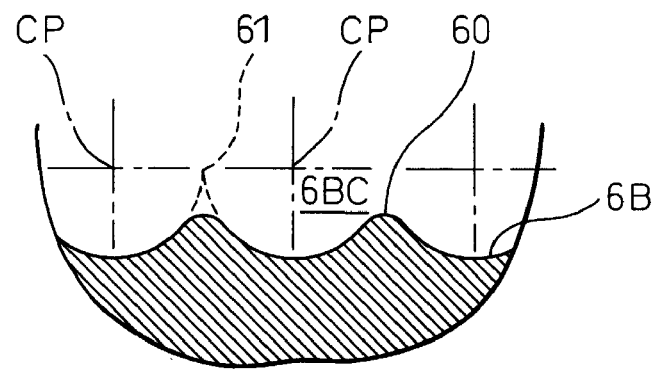
FIG. 8B is an enlarged partial sectional view of the bottom portion of the groove illustrated in FIG. 8A.
Figure 9A:
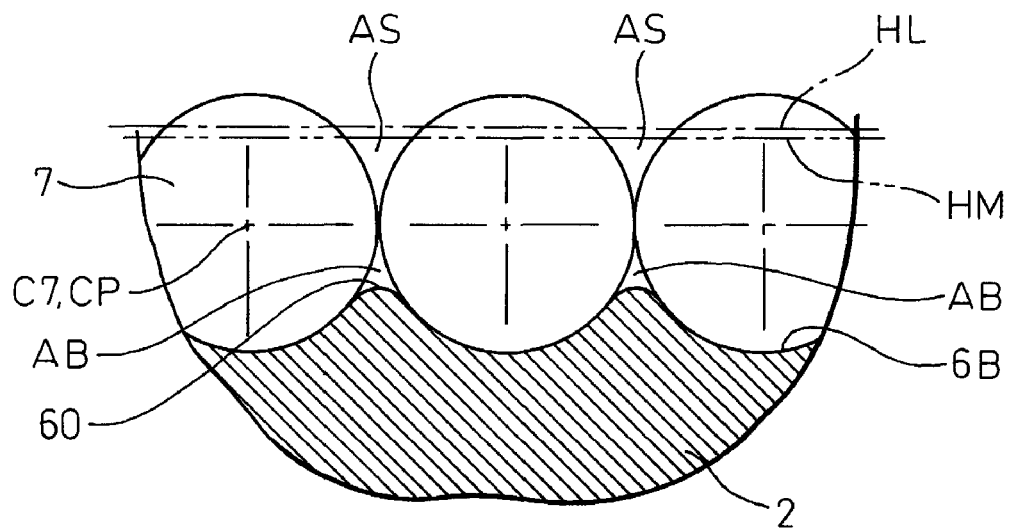
FIG. 9A is an enlarged partial sectional view, illustrating the groove of FIG. 8B, in which spherical sealing members are inserted.

FIG. 8A illustrates a variant of the groove 6 provided in lower casing member 2, illustrated in FIG. 7A, wherein the ridges 61 formed at the border of the adjacent hemispherical grooves BC of the bottom surface 6B, and the ridges 62 formed at the border of the adjacent cylindrically curved lateral surfaces connecting to the hemispherical grooves BC, are cut to form fillets 60. With the fillets 60, the hemispherical grooves 6BC are interconnected smoothly, as illustrated in FIG. 8B, but spaces AB are formed below the spherical sealing members 7, as illustrated in FIG. 9A.

Figure 9B:
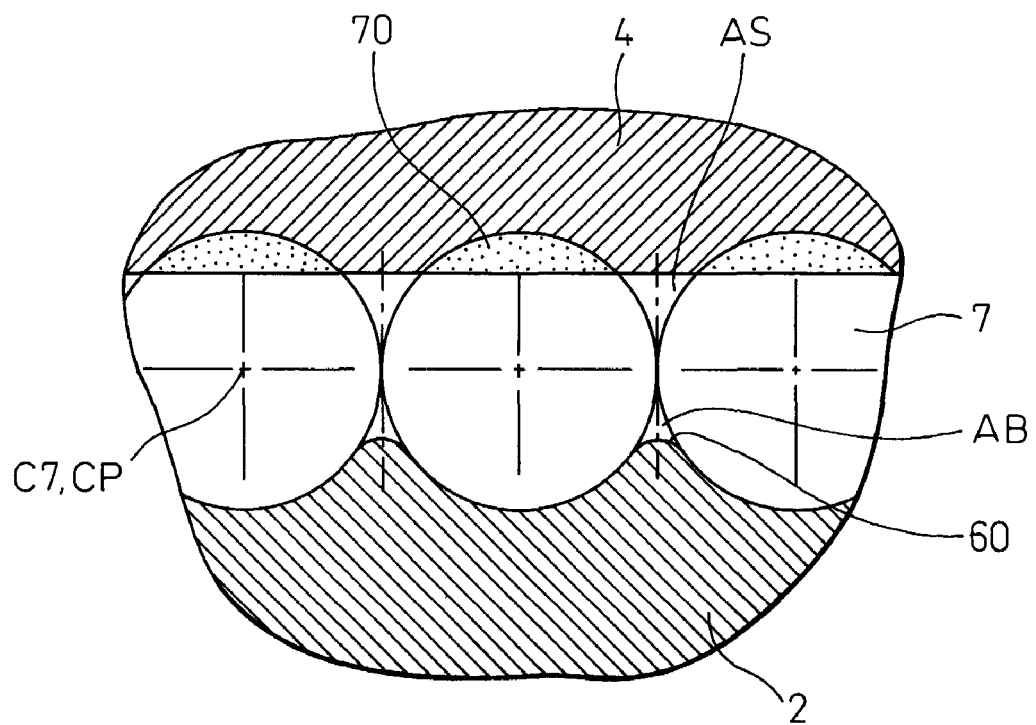
FIG. 9B is an explanatory view, illustrating the spherical sealing members compressed by the projection, when the projection is inserted in the groove of FIG. 9A.

Therefore, in this variant, the compression ratio of the spherical sealing members 7 by the elongated protrusion 4 of the upper casing member 1 is preferably larger than that determined for the geometrical shape illustrated in FIGS. 7A to 7C. To this end, the position HM of the lower end of the elongated protrusion 4 when the upper casing member 1 is fitted to the lower casing member 2 is, as illustrated in FIG. 9A, lower than the position HL thereof illustrated in FIG. 7C. As a result, as illustrated in FIG. 9B, the spaces AB and spaces AS are filled by the deformed upper portions 70 of the compressed spherical sealing members 7 when the lower end of the elongated protrusion 4 comes to the position HM.

Although no specific calculations are given herein, when the compression ratio of the spherical sealing members 7 by the elongated protrusion 4 is 30%, the volume of the portions of the spherical sealing members 7 compressed by the elongated protrusion 4 is large enough to fill the space AS between the upper portions of the spherical sealing members 7 and the elongated protrusion 4 and the spaces AB between the lower portions of the spherical sealing members 7 and the fillets 60. An excess volume of the compressed portions of the spherical sealing members 7, which is not used to fill the space AS and the space AB, is moved to a space surrounded by the lateral surfaces of the elongated protrusion 4 and the lateral surfaces of the groove 6, as explained in FIG. 4F. The compression ratio of the spherical sealing members 7 to completely fill the spaces AS and AB above and below the same can be easily determined using the basic functions of a two-dimensional CAD or three-dimensional CAD, in which the dimensions of each portion of the spherical sealing members 7 and the groove 6 are input.

Figure 10A:
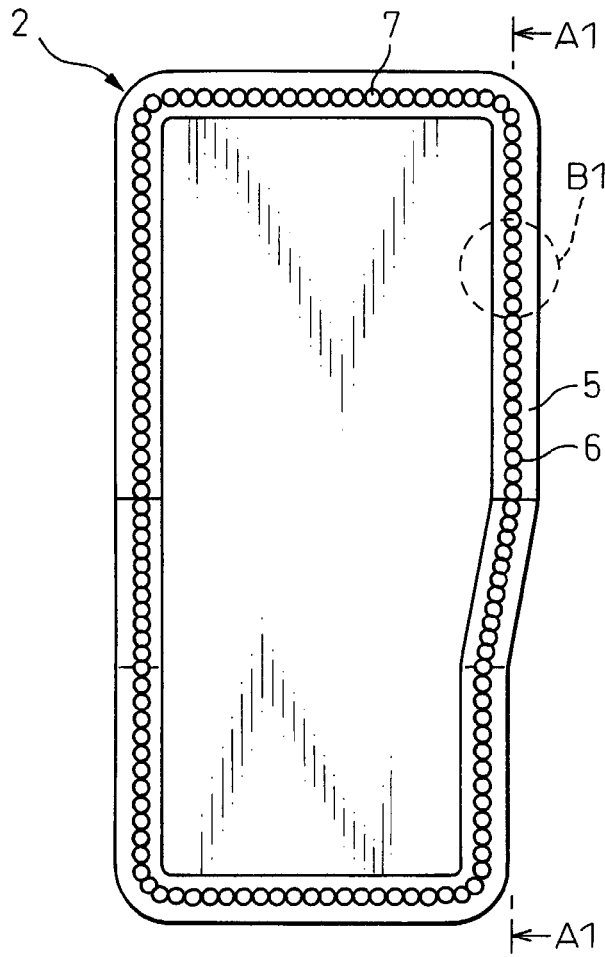
FIG. 10A is a plan view of the lower casing member in which spherical sealing members are inserted, according to the second embodiment of the present application.
Figure 10B:
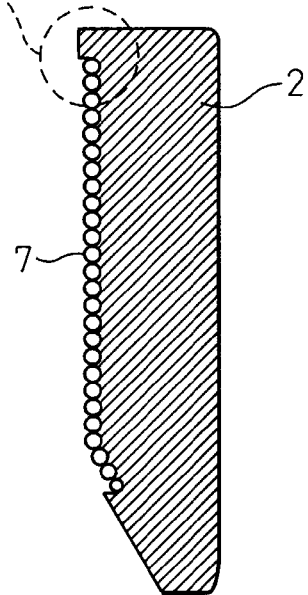
FIG. 10B is a sectional view taken along the line A1-A1 of FIG. 10A.
Figure 10C:
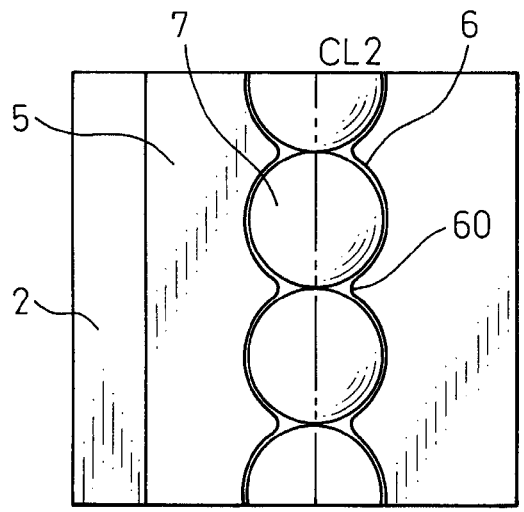
FIG. 10C is an enlarged partial view of the portion B1 in FIG. 10A.
Figure 10D:
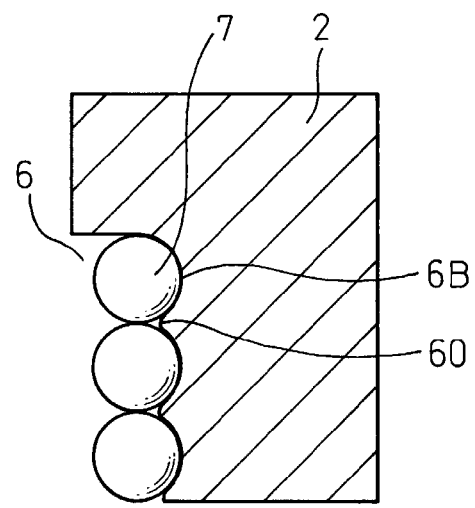
FIG. 10D is an enlarged partial view of the portion C1 in FIG. 10B.

FIG. 10A illustrates the lower casing member 2 of which the spherical sealing members 7 are arranged in the groove 6 provided with the fillets 60 illustrated in FIG. 8A, and FIG. 10B illustrates a sectional view taken along the line A1-A1 in FIG. 10A. Also, FIG. 10C is an enlarged partial view of the portion B1 of FIG. 10A, and FIG. 10D is an enlarged partial view of the portion C1 of FIG. 10B. As can be seen from these figures, when the modified groove 6 according to the variant of the second embodiment is formed in the fitting surface 5 of the lower casing member 2, the arrangement of the spherical sealing members 7 in the groove 6 can be visually confirmed at a glance, thus, no shortage of the number of the spherical sealing members 7 to be arranged in the groove occurs. Moreover, as the space between the spherical sealing members 7 and the groove 6 can be reduced, more reliable sealing can be achieved by the groove 6 than by the groove 6 in the first embodiment.

FIG. 11A illustrates an exterior appearance of a foldable mobile phone 40 provided with a casing of the present application, by way of example. The foldable mobile phone 40 in this example comprises a movable portion 41 provided with a display 43 and a main body 42 provided with operation keys 44. FIG. 11B illustrates the back side of the foldable mobile phone illustrated in FIG. 11A in which the rear casing member 45 of the movable portion 41 is open. The looped groove 6 is formed around the periphery of the front casing member 46 of the movable portion 41, as illustrated in the enlarged view, and the spherical sealing members 7 are tightly arranged in the groove 6 in contact with each other. Also, the rear casing member 45 is provided with an elongated protrusion (not illustrated) which compresses the spherical sealing members 7 when the rear casing member 45 is fitted to the front casing member 46, at the portion corresponding to the spherical sealing members 7. A dust-and-water proof structure comprised of the groove 6, the spherical sealing members 7, and the elongated protrusion is also provided in the main body 42.

Figure 12A:
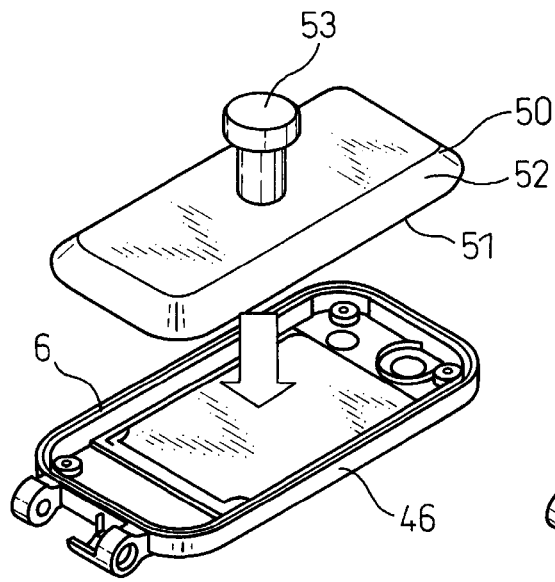
FIG. 12A is a perspective view, illustrating of the movable portion of the foldable phone illustrated in FIG. 11B wherein a jig is about to be attached thereto to insert the spherical sealing members, in a groove formed in the front casing member.
Figure 12B:
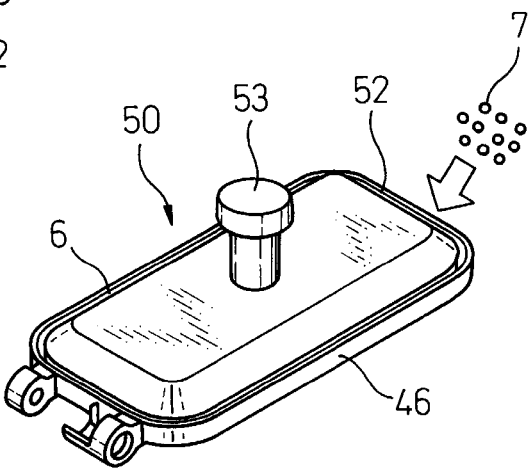
FIG. 12B is a perspective view, illustrating the front casing member of the movable portion of the foldable phone, on which the jig of FIG. 12A is placed.

FIG. 12A illustrates a jig 50 used to insert the spherical sealing members in the groove 6 of the front casing member 46 of the movable portion 41 of the foldable phone 40 illustrated in FIG. 11B. The jig 50 is in the form of a lid provided with an outer edge portion 51 along the inner periphery of the groove 6, and the portion adjacent to the outer edge portion 51 defines a tapered surface 52. Also, a knob 53 is provided on the top of the jig 50. When the spherical sealing members are inserted in the groove 6 of the front casing member 46 of the movable portion 41 using the jig 50, the knob 53 is held and the jig 50 is placed on the front casing member 46, so that the outer edge portion 51 of the jig 50 conforms with the inner periphery of the groove 6 of front casing member 46. This state is illustrated in FIG. 12B, and in this state, a large number of spherical sealing members 7 are dropped down onto the jig 50, the spherical sealing members 7 move along the tapered surface 52, and are introduced in the groove 6 of the front casing member 46.

Figure 12C:
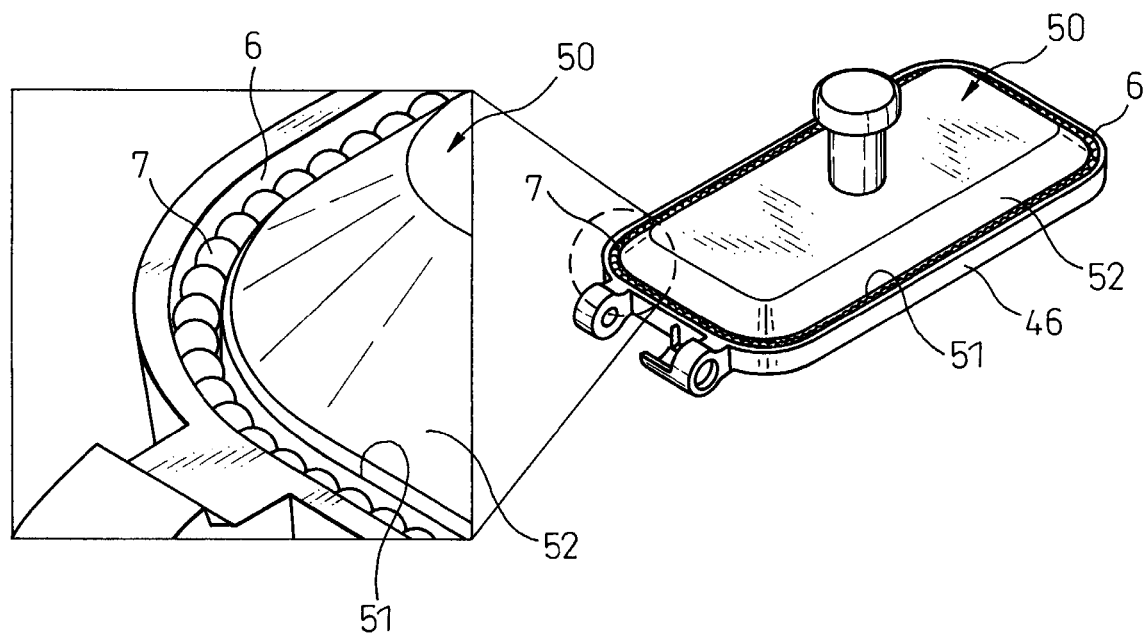
FIG. 12C is a perspective view, of the front casing member of the movable portion of the foldable phone, of which the spherical sealing members are inserted in the groove thereof using the jig illustrated in FIG. 12B, and an enlarged view of a part thereof.

FIG. 12C illustrates a state wherein the spherical sealing members 7 are arranged in the groove 6 of the front casing member 46. By using the jig 50, the spherical sealing members 7 can be easily inserted in the groove 6 in tight contact with each other, without permitting the spherical sealing members 7 to come to the inside of the groove 6 of the front casing member 46. After the spherical sealing members 7 are inserted in the groove 6 of the front casing member 46, the knob 53 is held and the jig 50 can be removed from the front casing member 46.

Alternatively, it is also possible to use a hollow pipe whose inner diameter is larger than the diameter of the spherical sealing member 7, wherein one end of the hollow pipe is placed on the groove 6 of the front casing member 46, and the spherical sealing members 7 are fed into the hollow pipe from the other open end, and are rolled therein to be arranged in the groove.

Figure 13:
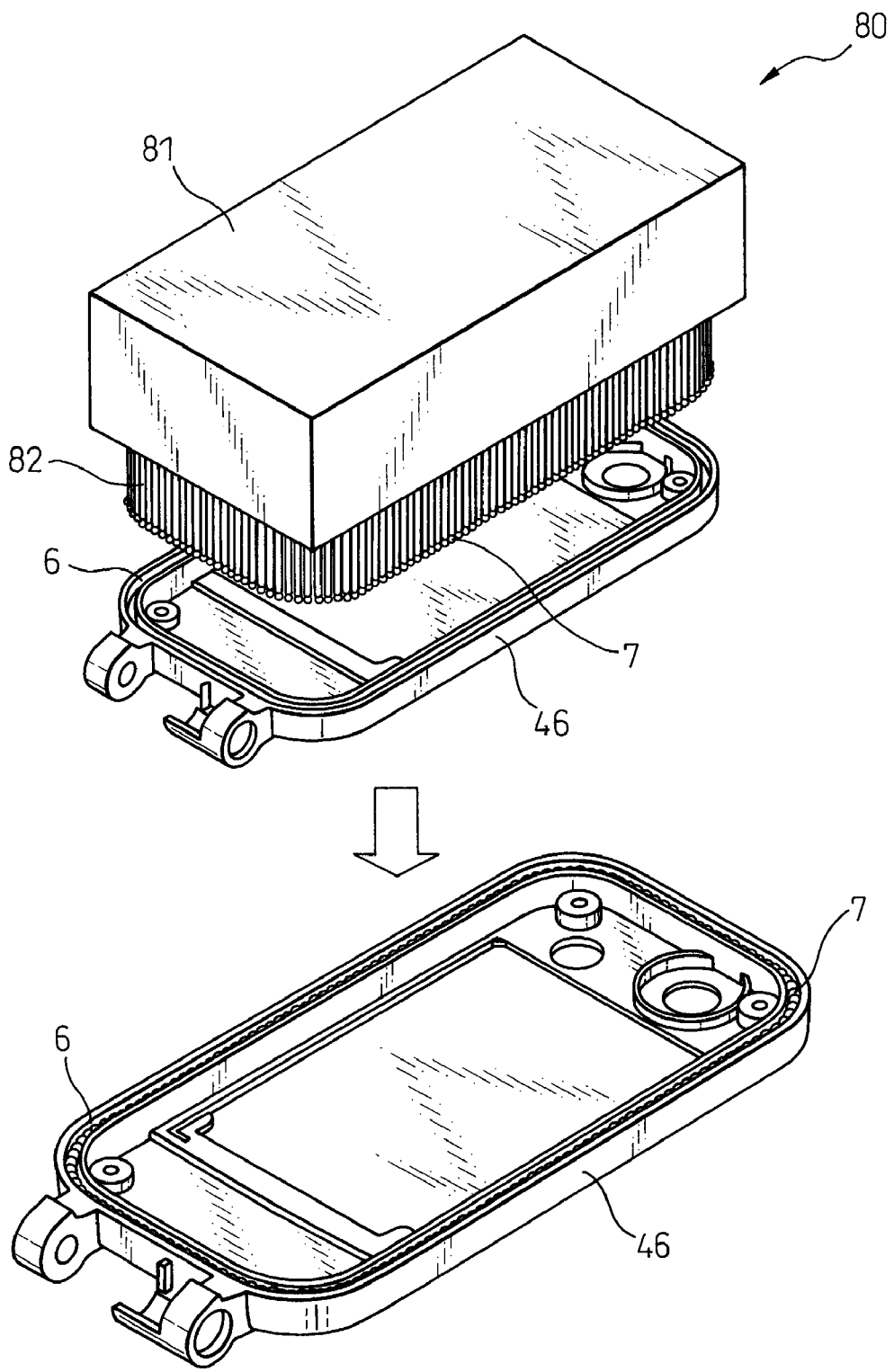
FIG. 13 is an explanatory view, illustrating a method of inserting the spherical sealing members in the groove formed in the front casing member of the movable portion of the foldable phone illustrated in FIG. 11B, using another jig.

FIG. 13 illustrates another jig 80 for inserting the spherical sealing members 7 in the groove 6 formed in the front casing member 46 of the movable portion 41 of the foldable mobile phone 40 illustrated in FIG. 11B, and a method of inserting the spherical sealing members 7, using the jig 80. The jig 80 is provided with a plurality of suction nozzles 82 on the bottom surface of the main body 81 thereof. The suction nozzles 82 have a diameter not more than the diameter of the spherical sealing member 7, and are identical in length. In addition, the suction nozzles 82 are placed on the lower surface of the main body 81 in accordance with the shape of the groove 6 wherein the spherical sealing members 7 are to be inserted. The suction nozzles 82 are connected to a vacuum suction device in the main body 81, so that when the vacuum suction device is operated, air is sucked from the openings of the suction nozzles 82.

When the spherical sealing members 7 are inserted in the groove 6 of the front casing member 46 of the movable portion of the foldable mobile phone using the jig 80, the jig 80 is brought to a pool of the spherical sealing members where a large numbers of spherical sealing members 7 are collected, and the vacuum suction device in the main body 81 is actuated. Consequently, the spherical sealing members 7 in the pool of the spherical sealing members are drawn by the suction nozzles 82 due to suction, and are held by the tip ends of all the suction nozzles 82. As the diameter of the suction nozzle 82 is the same as the diameter of the spherical sealing member 7, the spherical sealing members 7 are adjacently held by the tip ends of all the suction nozzles 82. This state is illustrated in FIG. 13.

Next, the jig 80, of which the suction nozzles 82 thereof hold the spherical sealing members 7 at the tip ends due to suction, is moved above the front casing member 46 of the movable portion of the foldable mobile phone. After that, the jig 80 is moved downward, and the suction nozzles 82 are aligned with groove 6 so that the spherical sealing members 7 held by the tip ends of the suction nozzles 82 are closely opposed to the groove 6. In this state, when the vacuum suction device in the main body 81 is inactivated, the spherical sealing members 7 fall from the suction nozzles due to their own weight, and are introduced in the groove 6 as illustrated in the lower half of FIG. 13. By using the jig 80, the correct number of spherical sealing members 7 can be inserted.

In practice, the jig 80 is attached to a tip portion of an actuator which is movable in three-dimensions, and moved between the front casing member 46 of the movable portion of the foldable mobile phone provided with the groove 6 and the spherical sealing member pool, through an automated control. Also, if a sensor, which detects whether the spherical sealing members 7 are held by all the suction nozzles 82 or not (for example, detection of air leakage during the suction), is provided in the main body 81, a shortage of the spherical sealing members 7, if any, can be preliminarily detected.

Figure 14A:
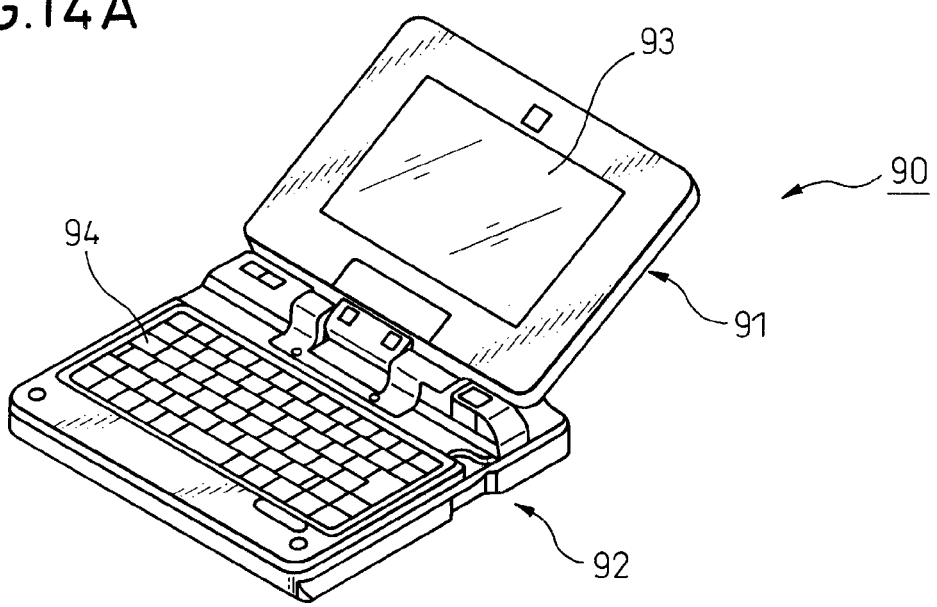
FIG. 14A is a perspective view of an exterior appearance of a laptop computer provided with a casing of the present application.
Figure 14B:
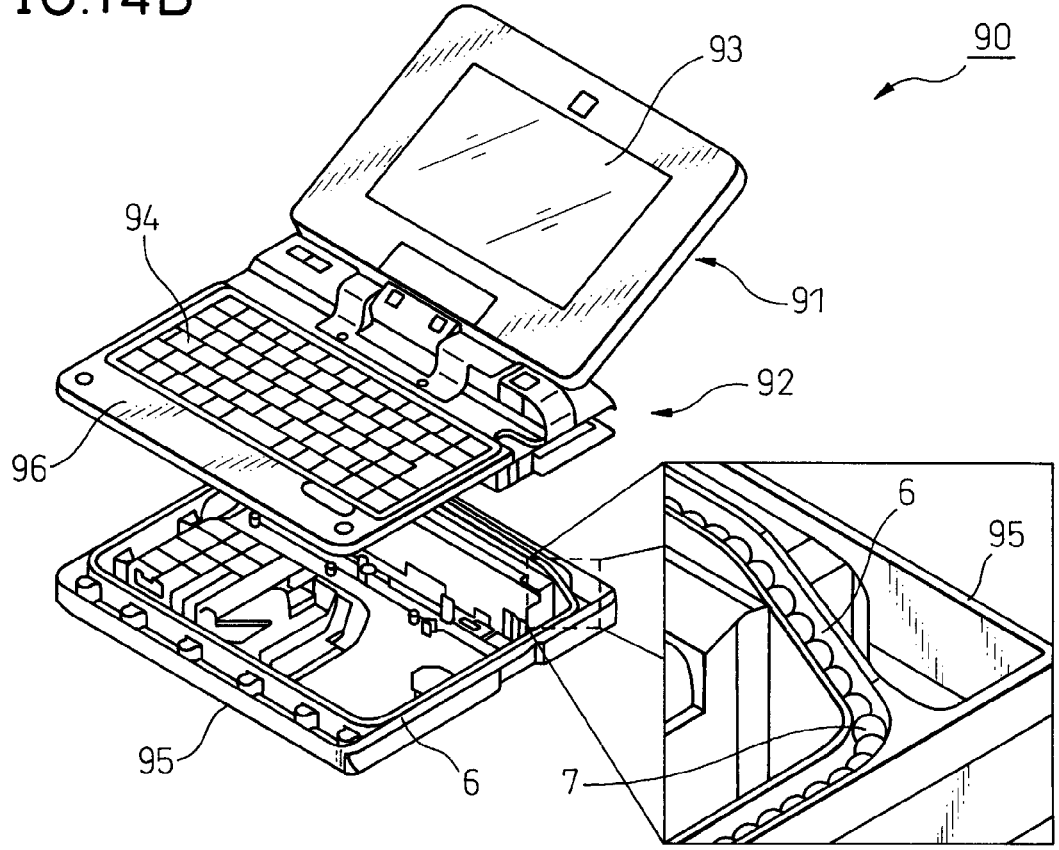
FIG. 14B is a perspective view of a disassembled laptop computer of FIG. 14A, of which the rear casing member of the main body thereof is opened to illustrate the mounting position of the spherical sealing members of the present application, and an enlarged view of a part thereof.

FIG. 14A illustrates an exterior appearance of an example of a laptop computer 90 provided with a casing of the present application. The laptop computer of this example has a movable portion 91 provided with a liquid crystal display 93, and a main body 92 provided with a keyboard 94. FIG. 14B illustrates the laptop computer 90 illustrated in FIG. 14A, wherein the front casing member 96 is detached from the rear casing member 95 of the main body 92. A looped groove 6 is formed around a periphery of the rear casing member 95 of the main body 92, and as illustrated in the enlarged view, the spherical sealing members 7 are arranged in contact with each other in the groove 6. Also, the front casing member 96 is provided with an elongated protrusion (not illustrated) which is adapted to compress the spherical sealing members 7 when the rear casing member 95 is fitted to the front casing member 96, at the portion corresponding to the spherical sealing members 7. A dust-and-water proof structure comprised of a groove 6, spherical sealing members 7, and an elongated protrusion is also provided in the movable portion 91.

Although the above discussion has been directed to a casing for a foldable mobile phone 40 and a casing for a laptop computer 90 as concrete examples of a casing having a dust-and-water proof structure of the present application, a casing having a dust-and-water proof structure of the present application is not limited to an electronic device, but can be applied to a box or housing whose inside is to be protected from dust or water.

Moreover, in the above explained embodiments, the diameter 2R of the spherical sealing member 7 is the same as the groove width W of the groove 6, however, in a casing provided with the dust-and-water proof structure of the present application, the diameter 2R of the spherical sealing member 7 may be somewhat smaller than the groove width W. Experiments have illustrated that a casing having a dust-and-water proof performance can be realized, when the spherical sealing members 7 whose diameter is in the range of 70% to 100% of the groove width are arranged continuously in the groove 6 without gaps therebetween.

Note that, the width of the elongated protrusion 4 is such that it can compress the tops of the spherical sealing members 7. In other words, an array of the spherical sealing members 7 arranged in the groove 6 can be compressed at the tops thereof by the elongated protrusion 4, when the smallest diameter of the spherical sealing members 7 is 70% of the groove width W. This is because unless the spherical sealing members 7 arranged in the groove 6 are compressed at the tops thereof, no uniform deformation of the spherical sealing members 7 in the groove 6 occurs, and thus, a sufficient sealing performance may not be achieved.

Further, the shape of the bottom surface of the groove 6 is hemi-cylindrical or hemispherical in the above explained embodiments, however, a dust-and-water proof function of a casing can be provided with a planar bottom surface, by adjusting the compression ratio of the spherical sealing members 7. Also, although the depth of the groove 6 is greater than the diameter of the spherical sealing member 7 in the above mentioned embodiments, the depth of the groove 6 may be smaller than the diameter of the spherical sealing member 7. Further, in practice, the diameter of the spherical sealing member 7 can be in the range of 2 to 3 mm.

According to the present application, the sealing member made of spherical elastic bodies brings about the following effects.

(1) The sealing member can be inserted in every shape of the groove without deforming it, therefore, the sealing member can be applied when the groove extends meanderingly, or when the portion to which the sealing member is to be attached is three dimensional.

(2) No inclination or twisting of the sealing member occurs when fitted to the sealing portion, thus, leading to good sealing performance.

(3) The sealing member can be easily inserted in the groove, using a jig without the need for a highly skilled operator, so that a dust-and-water proof structure of a casing can be effectively obtained.

(4) No hardening time is needed unlike when using a sealing agent, thus resulting in increased operability.

(5) When the casing is disassembled, the casings can be easily split without destroying the casing or the sealing portion, thus, resulting in high maintainability and recyclability.

All examples and conditional language recited herein are intended for pedagogical purposes to aid the reader in understanding the invention and the concepts contributed by the inventor to furthering the art, and are to be construed as being without limitation to such specifically recited examples and conditions, nor does not organization of such examples in the specification related to a showing of the superiority and inferiority of the invention. Although the embodiments of the present invention have been described in detail, it should be understood that the various changes, substitutions, and alternations could be made hereto without departing from the spirit and the scope of the invention.

What is claimed is:

1. A casing comprising two casing members, one of which is fittable to the other casing member to form the casing, wherein a dust-and-water proof structure provided at a fitting portion comprises:
   a groove formed continuously along periphery of a dust-and-water proof area of the one casing member;
   an elongated protrusion formed at the position to be inserted in the groove when the two casing members are fitted, said elongated protrusion having a width smaller than the groove width; and
   spherical elastic bodies each having the same diameter as the groove width, which are inserted and continuously arranged in the groove without gaps therebetween.

2. The casing according to claim 1,
wherein a cross-sectional shape of the groove in a direction perpendicular to the groove is semicircular with the radius identical to the radius of each spherical elastic body inserted in the groove.

3. The casing according to claim 1,
wherein said groove is provided, in its bottom surface, with continuous hemispherical recesses, each having the same radius size as the radius of each spherical elastic body inserted in the groove, said groove being provided, on its side surfaces, with continuous cylindrical wall surfaces smoothly connecting to the hemispherical recesses.

4. The casing according to claim 3,
wherein ridges defined by the adjacent hemispherical recesses, and ridges defined by the adjacent cylindrical wall surfaces are cut to form fillets.

5. The casing according to claim 1,
wherein when fitting portions of the two casing members are of a three dimensional shape and said groove is provided with a bent portion which is bent at a predetermined angle with respect to the vertical direction,
the bent portion is smoothly connected, with the groove at a curvature equal to or greater than the radius of each spherical elastic body inserted in the groove.

6. The casing according to claim 2,
wherein the height of the elongated protrusion is such that, when the two casing members are engaged, the protrusion is spaced from the bottom surface of the groove by a distance corresponding to the radius of the spherical elastic body.

7. The casing according to claim 3,
wherein the height of the elongated protrusion is such that, when the two casing members are engaged, so that the spherical elastic bodies are compressed, a space between the top surface of the elongated protrusion and the spherical elastic bodies is filled with deformed portions of the compressed spherical elastic bodies.

8. The casing according to claim 4,
wherein the height of the elongated protrusion is such that, when the two casing members are engaged, so that the spherical elastic bodies are compressed, a space between the top surface of the elongated protrusion and upper portions of the spherical elastic bodies, and a space between the fillets and lower portions of the spherical elastic bodies are filled with deformed portions of the compressed spherical elastic bodies.

9. The casing according to claim 1,
wherein a central line of the groove and a central line of the elongated protrusion conform with each other as viewed in a plan view, when the two casing members are engaged.

10. The casing according to claim 1,
wherein the overall length of the groove is an integer multiple of the diameter of the spherical elastic body.

11. A casing comprising two casing members, one of which is fittable to the other casing member to form the casing, wherein a dust-and-water proof structure provided at a fitting portion comprises:
a groove formed continuously along periphery of a dust-and-water proof area of the one casing member;
an elongated protrusion formed at the position to be inserted in the groove when the two casing members are fitted, said elongated protrusion having a width smaller than the groove width; and
spherical elastic bodies each having a diameter in the range of 70% to 100% of the groove width, which are inserted and continuously arranged in the groove without gaps therebetween.

12. The casing according to claim 11,
wherein the width of the elongated protrusion is such that when the diameter of each spherical elastic body corresponds to 70% of the groove width, the tops of the spherical elastic bodies can be compressed by the elongated protrusion.

13. The casing according to claim 1,
wherein the spherical elastic bodies are made of a solid gel-like material.

14. An electronic device, comprising a casing having two interfittable casing members, a groove formed continuously at a periphery of a dust-and-water proof area of one of the casing members, an elongated protrusion having a width narrower than the groove width, and formed in a position where it is inserted in the groove when the two casing members are fitted, and spherical elastic bodies each having the same diameter as the groove width, which are continuously arranged in the groove without gaps therebetween.

15. The casing according to claim 14,
wherein the electronic device is a laptop computer.

16. An electronic device, comprising a casing having two interfittable casing members, a groove formed continuously at a periphery of a dust-and-water proof area of one of the casing members, an elongated protrusion having a width narrower than the groove width, and formed in a position where it is inserted in the groove when the two casing members are fitted, and spherical elastic bodies each having a diameter in the range of 70% to 100% of the groove width, which are continuously arranged in the groove without gaps therebetween.

17. The casing according to claim 16,
wherein the electronic device is a laptop computer.

* * * * *